United States Patent
Takeda et al.

(10) Patent No.: US 7,165,871 B2
(45) Date of Patent: Jan. 23, 2007

(54) LAMP

(75) Inventors: Hitoshi Takeda, Shizuoka-ken (JP); Tsukasa Tokida, Shizuoka-ken (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 149 days.

(21) Appl. No.: 10/985,714

(22) Filed: Nov. 10, 2004

(65) Prior Publication Data

US 2005/0105301 A1   May 19, 2005

(30) Foreign Application Priority Data

Nov. 19, 2003   (JP)   ............................. 2003-389884

(51) Int. Cl.
   *B60Q 1/04*   (2006.01)
(52) U.S. Cl. ..................... 362/538; 362/539; 362/545
(58) Field of Classification Search ................ 362/507, 362/538, 545
   See application file for complete search history.

(56) References Cited

U.S. PATENT DOCUMENTS 4,453,806 A * 6/1984 Wick ........................... 359/707
6,867,929 B2 * 3/2005 Lopez-Hernandez et al. .... 359/726
2004/0145895 A1 * 7/2004 Ouderkirk et al. .......... 362/260
2006/0077667 A1 * 4/2006 Lui et al. .................... 362/300

FOREIGN PATENT DOCUMENTS

JP   2002-231013   8/2002

OTHER PUBLICATIONS

Patent Abstracts of Japan, Publication No. 2002-231013 dated Aug. 16, 2002, 2 pgs.

* cited by examiner

*Primary Examiner*—Ali Alavi
*Assistant Examiner*—Hargobind S. Sawhney
(74) *Attorney, Agent, or Firm*—Osha Liang L.L.P.

(57) ABSTRACT

The lamp for generating light, comprises a semiconductor light emitting element for emitting light, a fluorescent material, provided away from the semiconductor light emitting element, a first optical member operable to focus the light generated by the semiconductor light emitting element on the fluorescent material; and a second optical member having an optical center at a position where the fluorescent material is provided, operable to emit light from the fluorescent material based on the light focused by the first optical member to an outside of the lamp. The lamp is used as a headlamp in a vehicle, and the second optical member emits the light from the fluorescent material to the outside of the lamp, so that the second optical member form sat least one of a part of a cut line that defines a boundary between a bright region and a dark region of the headlamp.

9 Claims, 11 Drawing Sheets

LAMP

This patent application claims priority from Japanese Patent Application No. 2003-389884 filed on Nov. 19, 2003, the contents of which are incorporated herein by reference.

BACKGROUND OF THE INVENTION

1. Field of the Invention

The present invention relates to a lamp. More particularly, the present invention relates to a lamp for generating light.

2. Description of the Related Art

Recently, a vehicular lamp using semiconductor light emitting element such as a LED has been well known as disclosed in Japanese Patent Application Publication (Laid-Open) No. 2002-231013. Pages 2–6, FIGS. 1–13. For example, in terms of design, using the semiconductor light emitting element such as the LED as a headlamp in a vehicle is considered. In use of the headlamp in the vehicle, it is necessary to form a predetermined light distribution pattern for the safety. The light distribution pattern includes a region called "hot zone", which is illuminated more brightly than the other region in the light distribution pattern.

In order to illuminate the hot zone more brightly, it is preferable to emit spotlight with high luminance to the hot zone. In order to generate the spot light with high luminance, it is preferable to generate the light with high luminance from a narrow region.

SUMMARY OF THE INVENTION

Therefore, it is an object of the present invention to provide a lamp, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a lamp for generating light, comprises a semiconductor light emitting element for emitting light, a fluorescent material, provided away from the semiconductor light emitting element, a first optical member operable to focus the light generated by the semiconductor light emitting element on the fluorescent material; and a second optical member having an optical center at a position where the fluorescent material is provided, operable to emit light from the fluorescent material based on the light focused by the first optical member to an outside of the lamp.

The lamp may be used as a headlamp in a vehicle, and the second optical member may emit the light from the fluorescent material to the outside of the lamp, so that the second optical member may form at least one of a part of a cut line that defines a boundary between a bright region and a dark region of the headlamp.

The fluorescent material may be provided in a forward direction of the semiconductor light emitting element, and the second optical member may be a reflector that is provided between the semiconductor light emitting element and the fluorescent material, and reflect the light entered from the fluorescent material forward, and the reflector may include a light transmitting part operable to transmit light along a direction from the semiconductor light emitting element to the fluorescent material and, the first optical member may be a lens operable to focus the light transmitted through the light transmitting part on the fluorescent material.

The light transmitting part may be a hole, provided at a part of the second optical member, and at least a part of the lens may be fitted to the hole, so that the lens may be fixed to the second optical member.

The semiconductor light emitting element may generate ultraviolet light, the lamp may generate white light based on the ultraviolet light, and the lamp further may comprise a transparent member made of a material that transmits white light but obscures ultraviolet light, in a forward direction of the fluorescent material, operable to transmit an incident light entered from the fluorescent material via the second optical member to a front of the vehicle.

The lamp may further comprise a second reflector formed on a part on a rear plane in the transparent member, operable to reflect the light generated from the fluorescent material in a backward direction, and the fluorescent material may be coated to at least a part of the second reflector so that the fluorescent material may be opposed to the transparent member across the second reflector, and the second optical member may reflect the light reflected by the second reflector forward, so that the reflected light may be transmitted through the transparent member and the second optical member may emit the reflected light to the outside of the lamp.

The lamp may further comprise a plurality of the semiconductor light emitting elements, and the first optical member may focus the light from the plurality of the semiconductor light emitting elements on the same fluorescent material.

The lamp may further comprises a light transmitting member made of material which transmits a light from the fluorescent material, to be extended along a direction from the second optical member to the fluorescent material, and the second optical member may be formed on a part on a surface of the light transmitting member, and the lens may be formed integrally with the light transmitting part, having the same material of the light transmitting member, and the fluorescent material may be coated on a part of a plane that is opposed to the second optical member in the light transmitting member.

The lamp may further comprise an optical fiber, and the optical fiber may receive the light generated by the semiconductor light emitting element at one end, and emit the light from the other end, and the first optical member may focus the light emitted from the optical fiber on the fluorescent material. In addition, the semiconductor light emitting element may be a laser diode.

The lamp to which the present invention may be applied includes, but not limited to, headlamps such as a regular headlamp, fog lamp or cornering lamp for automobiles, motorcycles or trains. The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
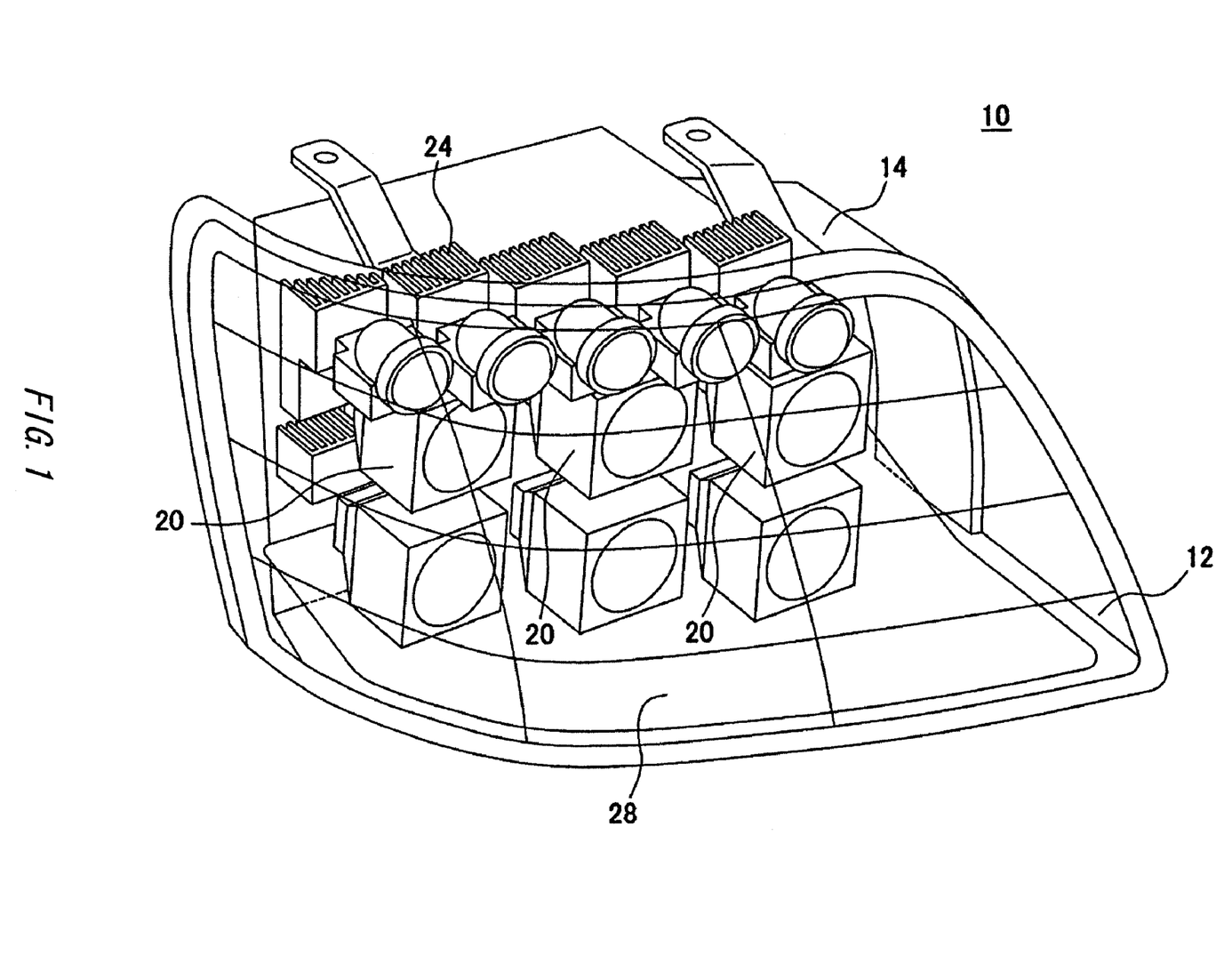
FIG. 1 is a perspective view of the vehicular lamp 10 according to an embodiment of the present invention.
Figure 2:
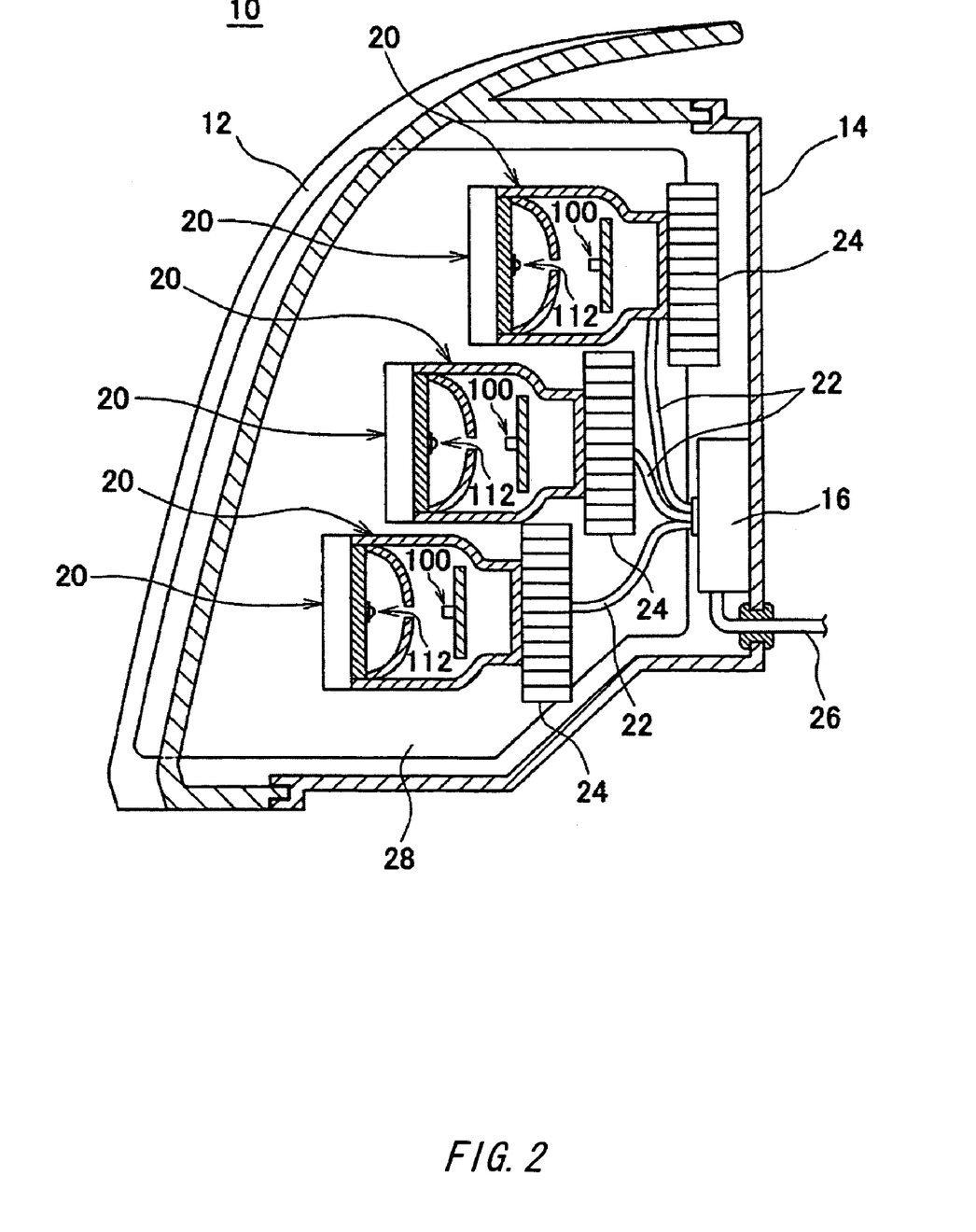
FIG. 2 is a cross-sectional view thereof taken along a horizontal plane crossing respective light source units 20 in the middle stage.

FIGS. 1 and 2 show an exemplary configuration of a vehicular lamp 10 according to an embodiment of the present invention. FIG. 1 is a perspective view of the vehicular lamp 10, and FIG. 2 is a cross-sectional view thereof taken along a horizontal plane crossing respective light source units 20 in the middle stage. The vehicular lamp 10 is an automotive headlight (or headlamp) used for an automobile such as a vehicle, for example, and emits light forward of the automobile. The vehicular lamp 10 includes a plurality of light source units 20, an outer lens 12, a lamp body 14, a circuit unit 16, a plurality of heat-radiation members 24, an extension reflector 28, a cable 22 and a cable 26.

Each of the light source units 20 includes a light source module I00 and a fluorescent material 112. The light source module 100 generates the ultraviolet light and emits the generated ultraviolet light to the fluorescent material 112. The fluorescent material 112 generates white light based on the ultraviolet light from the light source module 100. Each of the light source units 20 emits white light having a predetermined light distribution pattern in a forward direction of the automobile in accordance with the white light from the fluorescent material 112. For example, the light source unit 20 is supported by a lamp body 14, enable to be inclined by an aiming mechanism for adjusting a direction of an optical axis of the light source unit 20. The light source unit 20 may be supported by the lamp body 14 in such a manner that its optical axis is at a downward angle of about 0.3° to about 0.6° with respect to the horizontal plane when the vehicular lamp 10 is mounted on the body of the automobile.

The light source units 20 may have the same or similar light distribution characteristics or different light distribution characteristics. In an alternative example, one light source unit 20 may include a plurality of light source modules 100.

The outer lens 12 and the lamp body 14 form a lamp room of the vehicular lamp 10 and this room accommodates a plurality of light source units 20. The outer lens 12 and the lamp body 14 may air-tightly seal the light source unit 20 and protect it from water. For example, the outer lens 12 is formed of transparent material that can transmit light generated by the light source module 100, for example, and is provided on a front face of the automobile to cover the light source units 20 from the front. The lamp body 14 is provided to be opposed to the outer lens 12 with the light source units 20 interposed therebetween to cover the light source units 20 from behind. The lamp body 14 may be formed integrally with the body of the automobile.

The circuit unit 16 is a module in which a lighting circuit for lighting the light source module 100 and the like are formed therein. The circuit unit 16 is electrically connected to the light source unit 20 via the cable 22. The circuit unit 16 is also connected to the outside of the vehicular lamp 10 electrically via the cable 26.

The heat radiating members 24 are heat sinks, which are in contact with at least a part of the light source units 20. The heat-radiating member 24 is made of a material such as metal, of which coefficient of thermal conductivity is higher than air. The heat radiating members 24 are pivotally movable on the aiming mechanism, accompanying the light source units 20 within a range of the movement of the light source units 20, and each of the heat radiating members 24 is provided with a sufficient space against the lamp body 14 so that each light axis of the light source units 20 is adjusted. The heat radiating members 24 may be integrally formed as a metal member. In this case, the entire heat radiating members 24 can dissipate heat efficiently.

The extension reflector 28 is made of a thin metal plate, reaching the cover 12 from the bottoms of the light source units 20. The extension reflector 28 covers at least a part of an inner surface of the lamp body 14 so as to conceal the inner surface of the lamp body 14, thereby improving the appearance of the vehicular lamp 10.

At least a part of the extension reflector 28 touches the light source units 20 and/or the heat radiating members 24. In this case, the extension reflector 28 acts as a heat conducting member for conducting the heat produced by the light source module 100 to the cover 12. Accordingly, the extension reflector 28 dissipates the heat of the light source module 100. A part of the extension reflector 28 is fixed to the outer lens 12 or the lamp body 14. The extension reflector 28 may be shaped to cover the top, bottom, and sides of the light source units 20.

According to this embodiment, using the light source module 100 as the light source, the light source units 20 can be small. By this, since the degree of freedom for arrangement of the light source units 20 is improved, it is possible to provide the vehicular lamp 10 of good characteristics for design.

Figure 3:
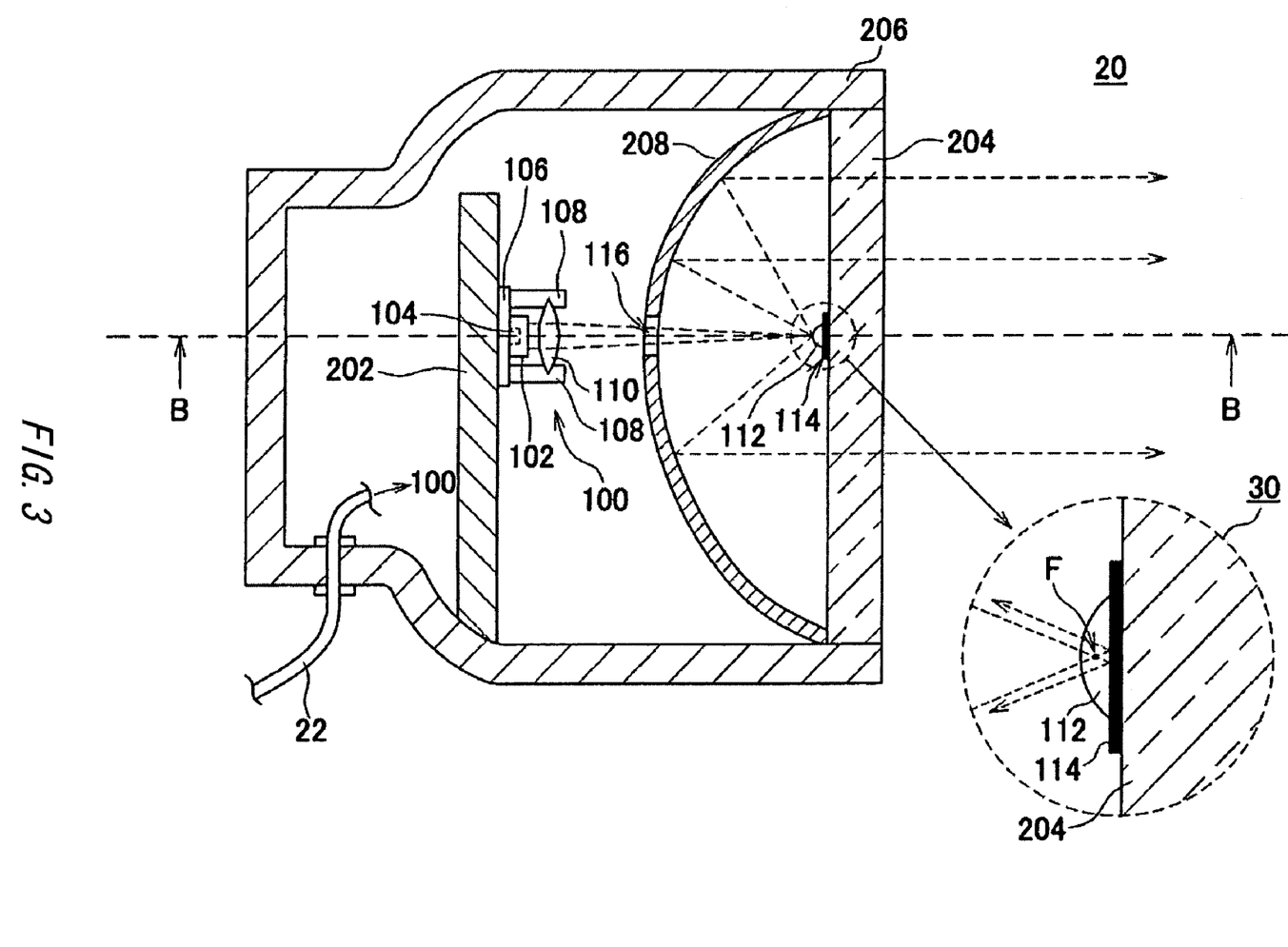
FIG. 3 shows a cross-sectional view of a light source unit 20 taken on line A—A in FIG. 4.
Figure 4:
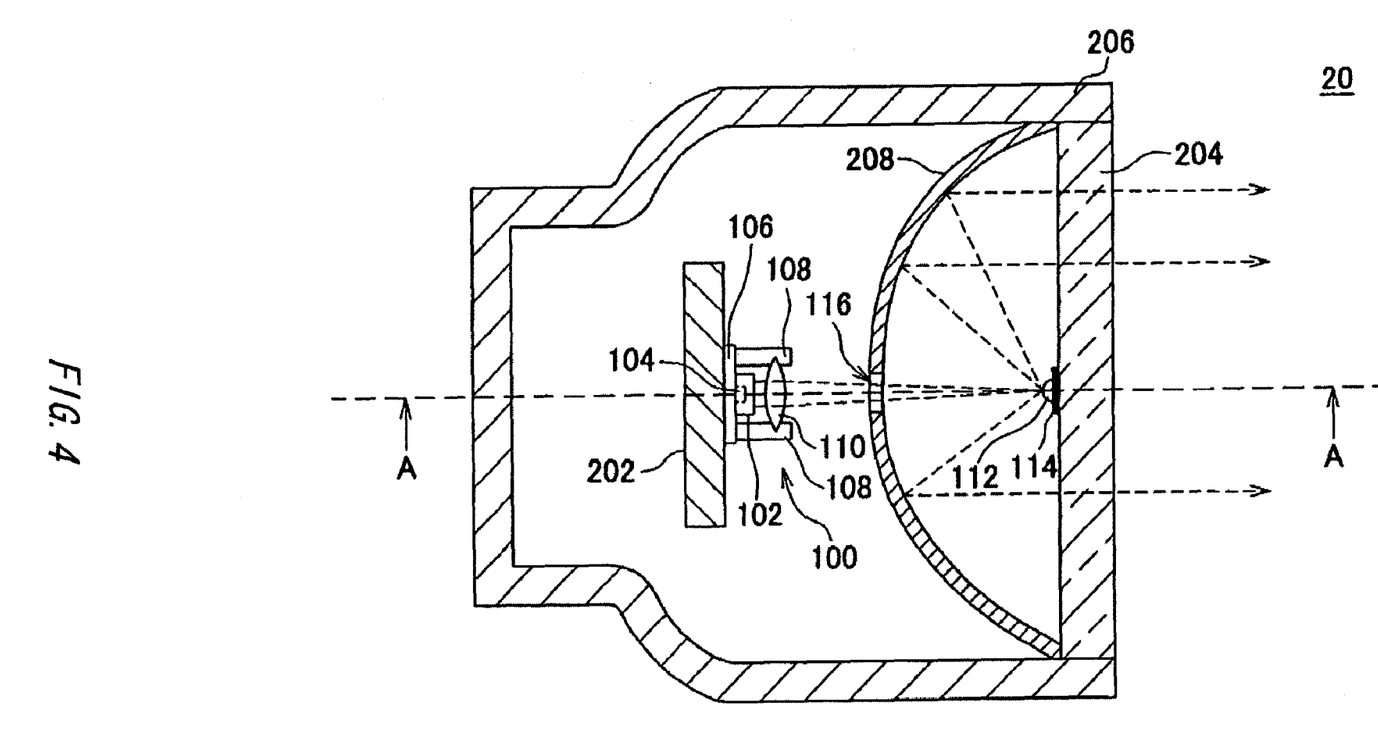
FIG. 4 shows a cross-sectional view of the light source unit 20 taken on line B—B in FIG. 3.

FIGS. 3 and 4 show an exemplary configuration of the light source unit 20. FIG. 3 shows a cross-sectional view of the light source unit 20 taken on line A—A in FIG. 4. FIG. 4 shows a cross-sectional view of the light source unit 20 taken on line B—B in FIG. 3. The light source unit 20 includes a securing member 202, the light source module 100, a light transmitting member 204, a reflector 114, a fluorescent material 112, a reflector 208, and a housing 206.

The securing member 202 is a plate-like member and is secured to the housing 206 so that one surface of the securing member 202 faces a front of the automobile, for example. The securing member 202 supports and secures the bottom surface of the light source module 100 on that one surface. The securing member 202 is made of material having higher thermal conductivity than air, such as metal, and dissipates heat produced by the light source module 100. In this example, since the securing member 202 is in contact with the housing 206 at its one end, the securing member 202 conducts the heat produced by the light source module 100, thereby cooling the light source module 100.

The light source module 100 includes a laser module 102, a laser diode 104, a lens holding member 108, a lens 110 and a substrate 106. The laser module 102 includes the laser diode 104. The laser diode 104 generates ultraviolet light based on the power received from the outside of the light source unit 20 via the cable 22. The laser module 102 emits the light generated from the laser diode 104 to the lens 110. The laser module 102 and the lens holding member 108 are fixed to the substrate 106.

The lens holding member 108 holds the lens 110 to be opposed to an light emitting surface of the laser module 102. Thus, the lens 110 emits the light generated by the laser diode 104 forward. Since the light from the laser diode 104 has strong directivity, the laser diode 104 can emit the light parallel to an optical axis of the lens 110 into the lens 110 from the whole emitting surface. Therefore, the lens 110 can focus the light generated by the laser diode 104 on the fluorescent material 112 effectively. In addition, the laser diode 104 is an example of the semiconductor light emitting element of the present invention, and the lens 110 is an example of the first optical member of the present invention.

The substrate 106 is a plate-like member and fixes the light source module 100 to the surface of the securing member 202. At least a part of the substrate 106 is formed from material having higher thermal conductivity than air, such as metal, and conducts heat produced by the laser module 102 to the securing member 202. The substrate 106 is electrically connected to the laser module 102, and supplies the power received from the outside of the light source unit 20 to the laser module 102.

The light transmitting member 204 is made of material that transmits white light but obscures ultraviolet light. The light transmitting member 204 is formed in a forward direction of the fluorescent material 112. In this case, the forward direction is defined as a traveling direction of the light from the headlamp. The light transmitting member 204 may be, for example, a transparent lens. The light transmitting member 204 may include lens steps. The lens steps may be of the Fresnel lens type. The light transmitting member 204 is fixed to the housing 206, so as to be opposed to a front surface of the securing member 202. Since the light transmitting member 204 is made of material that cuts off the ultraviolet light, it is possible to prevent the emission of the harmful ultraviolet light from the outside of the vehicle. In alternative example, the light transmitting member 204 may be made of material that transmits the ultraviolet light and a member for cutting off the ultraviolet light may be provided at the front surface of the light transmitting member 204.

The reflector 114 is formed on a part on a rear plane in the light transmitting member 204, as shown in an enlarger illustration 30. The reflector 114 is an example of the second reflector of the present invention. For example, the fluorescent material 112 is formed to be point-like by coating a binder resin in which a particulate fluorescent material is kneaded on the rear plane of the reflector 114. As described above, the fluorescent material 112 is coated to at least the part of the reflector 114 so that the fluorescent material 112 is opposed to the light transmitting member 204 across the reflector 114. In this embodiment, a surface area of the fluorescent material 112 contacting with the reflector 114 is smaller than the area of the emitting surface of the laser diode 104. Therefore, the fluorescent material 112 emits the light from a area smaller than the area of the emitting surface of the laser diode 104. Accordingly, since an optical design can be done based on the light from such a small region, the optical design of the light source unit 20 can be done easily.

The fluorescent material 112 is provided at the front of the vehicle, separated from the laser diode 104. Therefore, the heat produced by laser diode 104 is not conducted to the laser diode 104 easily. Therefore, it is possible to prevent the degradation of the fluorescent material 112, such as a darkening. In addition, since the optical system and the heat radiation system are designed independently, this improves the freedom in design of the light source unit 20.

The reflector 208 is provided between the light source module 100 and the fluorescent material 112. The reflector 208 includes a plane opposed to the fluorescent material 112, which the plane is formed to be a parabolic revolution. The reflector 208 has a focus F of the plane of the parabolic revolution at a position where the fluorescent material 112 is provided. Therefore, the reflector 208 controls the diff-used light from the fluorescent material 112 to be parallel, thereby emitting the paralleled light to the forward direction. The reflector 208 is an example of the second optical member in the present invention, and the focus F is an example of the optical center of the present invention. The reflector 208 includes a light transmitting part 116. The light transmitting part 116 is a hole thorough which the light from the light source module 100 to the fluorescent material 112 transmits. Alternatively, the lens step may control the diffused light to form parallel beam.

The housing 206 is a chassis for accommodating the securing member 202, the light source module 100, the reflector 208, the fluorescent material 112 and the reflector 114. The housing 206 includes an opening part at its front, and holds the light transmitting member 204 at this opening part. The housing 206 may further conduct the heat received from the light source module 100 to the heat-radiation member 24 (see FIG. 1) via the 202. Thus, the heat of the light source module 100 can be dissipated appropriately.

The processing of the light source unit 20 for emitting the light from the laser diode 104 in the forward direction will be explained. The lens 110 focuses the ultraviolet light, which is generated from the laser diode 104 and transmits the light transmitting part 116, on the fluorescent material 112. Thus, the fluorescent material 112 can generate the white light with high luminance. The fluorescent material 112 generates the white diffused light based on the ultraviolet light that is emitted to the fluorescent material 112. The reflector 114 reflects the light in a backward direction, which the light is generated and emitted from the fluorescent material 112 in the forward direction. Therefore, it is possible to utilize not only the light from fluorescent material 112 to the reflector 208 but also the light emitted from the fluorescent material 112 in the forward direction, for the light distribution of the light source unit 20. Accordingly, almost all of the light from the fluorescent material 112 can be emitted to the reflector 208.

The reflector 208 reflects the light from the fluorescent material 112 and the reflector 114 to the front of the vehicle. The light transmitting member 204 transmits the light entered from both the fluorescent material 112 and the reflector 114 to the front of the vehicle via the reflector 208. As described above, the light source unit 20 emits the light from the fluorescent material 112 based on the light focused on by the lens 110 to the outside of the light source unit 20. Since the fluorescent material 112 emits the light with higher luminance than that of the light from the laser diode 104, from an area smaller than the emitting surface of the laser diode 104, the reflector 208 can emit the spotlight with light luminance in the forward direction. Therefore, the light source unit 20 can form the distribution pattern at the front of the vehicle appropriately.

In the case in which the light source module 100 is provided between the reflector 208 and the fluorescent material 112, a part of the light from the fluorescent material 112 is blocked by the light source module 100 and consequently the part of the light is not emitted to the reflector 208. However, according to this embodiment, since the reflector 208 is provided between the light source module 100 and the fluorescent material 112, almost all of the light from the fluorescent material 112 can be reflected by the reflector 208. Therefore, the light source unit 20 can emit the light from the fluorescent material 112 to the outside of the light source unit 20 efficiently.

In the example, the laser diode 104 in the laser module 102 generates the ultraviolet light based on the power received from the outside of the light source unit 20. In another example, the laser diode 104 may generate blue light, and the fluorescent material 112 may generate yellow diffused light as a complementary color based on the blue light from the laser diode 104. In this case, the reflector 114 may include unevenness on its surface. Therefore, the reflector 114 diff-uses the blue light from the laser diode 104 to the whole reflection surface of the reflector 208. Next, the reflector 208 reflects white light to the front of the light source unit 20 based on both the blue light generated by the laser diode 104 and the yellow light from the fluorescent material 112. Therefore, the light source unit 20 emits the white light to the outside of the light source unit 20. Alternatively, the laser module 102 may be a LED.

Figure 5:
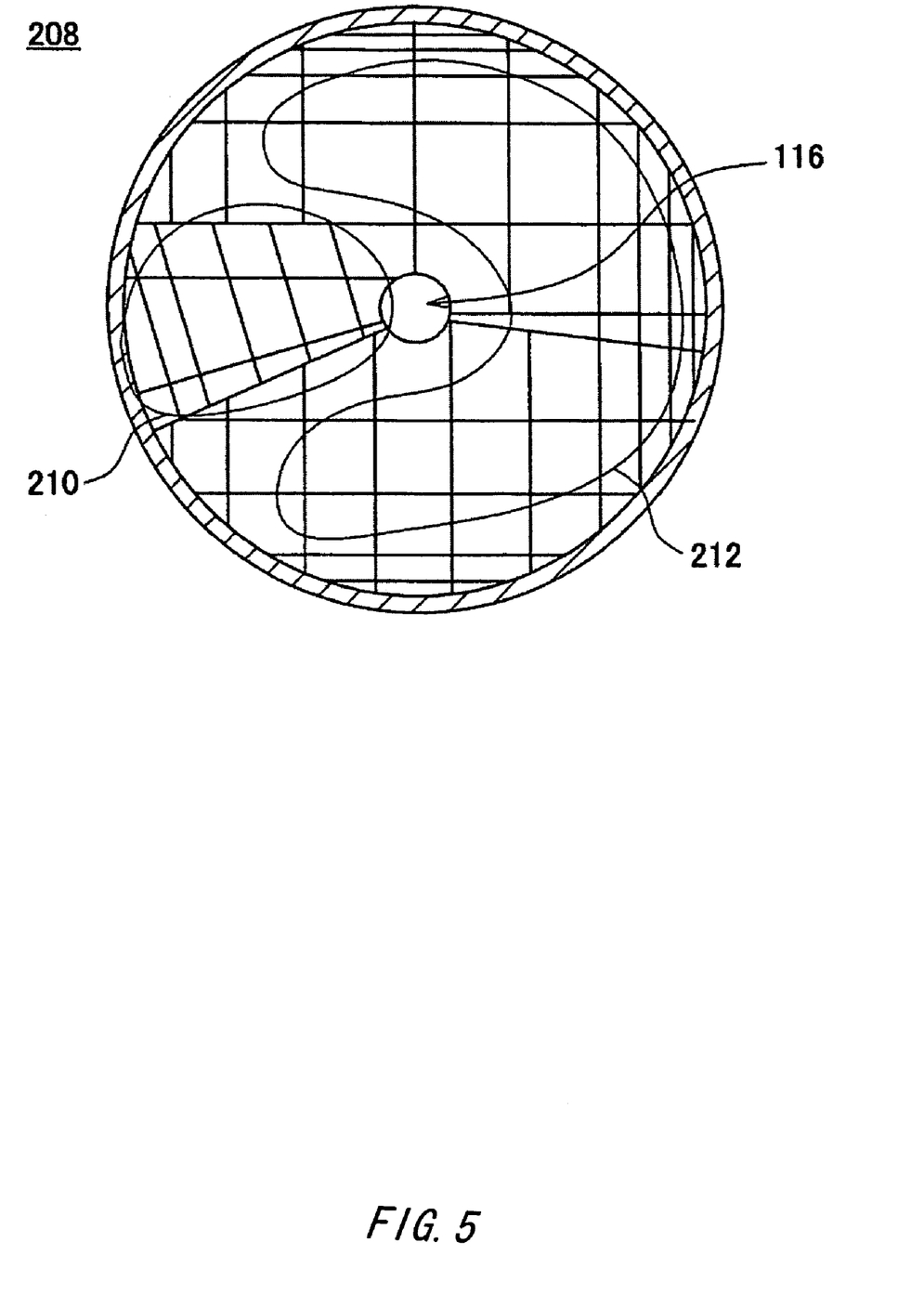
FIG. 5 shows an exemplary configuration of the reflector 208.
Figure 6:
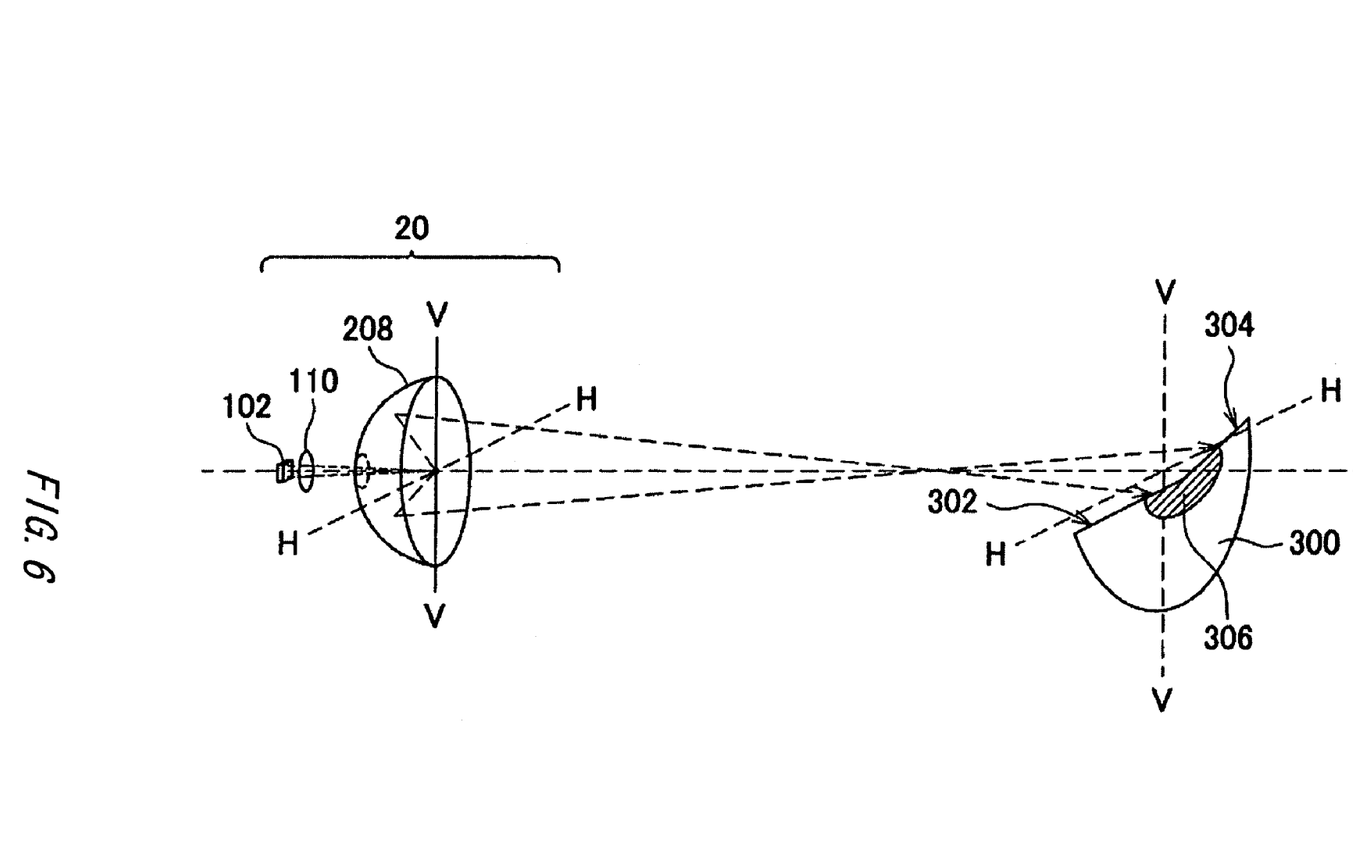
FIG. 6 shows an exemplary configuration of a light distribution 300 formed by the vehicular lamp 10.

FIG. 5 shows an exemplary configuration of the reflector 208. FIG. 6 shows an exemplary configuration of the light distribution pattern 300 formed by the vehicular lamp 10 (see FIG. 1). The light distribution pattern 300 is a low beam light distribution pattern which is formed on a vertically virtual screen disposed 25 meters away from the front of the vehicular lamp 10. In this example, the vehicular lamp 10 forms the light distribution pattern 300 having a the horizontal cut line 302 which determines the boundary between a bright area and a dark area in an approximately horizontal direction and an oblique cut line 304 which determines the boundary between a bright area and a dark area in an oblique direction by 15 degree against the horizontal direction.

The reflector 208 includes an oblique reflecting surface 210 and a horizontal reflecting surface 212. The oblique reflecting surface 210 and the horizontal reflecting surface 212 have a plurality of segments, each of which is rectangular shape or oblique trapezoidal shape. Each of the segments is formed at each point on the predetermined plane of the parabolic revolution, in accordance with the shape of the inclined cut line or the shape of the horizontal cut line, which are to be formed on the plane. The reflector 208 has the optical center at the position where the fluorescent material 112 is provided, and emits the light from the fluorescent material 112 to the outside of the light source unit 20. Thus, the reflector 208 forms at least a part of the oblique cut line or a part of the horizontal cut line, which define the boundary of the light distribution pattern of the vehicular lamp 10. In this example, the reflector 208 forms at least the part of the oblique cut line 304 based on the light reflected off the oblique reflecting surface 210, and forms at least the part of the horizontal cut line 302 based on the light reflected off the horizontal reflecting surface 212.

In the light distribution pattern 300, an area 306 near to a point where the horizontal cut line 302 and the oblique cut line 304 intersect is called hot zone, and it is preferable that the area 306 is illuminated more brightly than the other areas in the light distribution pattern 300 in terms of the safety. In this example, since the lens 110 focuses the light from the laser diode 104 on the fluorescent material 112, the fluorescent material 112 can generate high luminance light. Therefore, the light source unit 20 can emit the light with high luminance in the forward direction. Accordingly the light source unit 20 can illuminate the hot zone brightly.

Alternatively, the vehicular lamp 10 may illuminate the areas except the hot zone in the light distribution pattern 300 by using another reflector 208 not including the oblique reflecting surface 210, besides the reflector 208 shown in FIG. 5. As described above, the vehicular lamp 10 may include the light source units 20 of which light distribution patterns are different from each other, and the vehicular lamp 10 may form the light distribution pattern 300 based on the light generated by each of the light source units 20.

According to this example, the light source units 20 form the light distribution pattern 300 by each of the segments of the reflector 208. Alternatively, in another example, the light source units 20 may form the light distribution pattern 300 by both the reflector 208 having a plane of a parabolic revolution not divided into a plurality of the segments and the light transmitting member 204 formed with lens steps. In this case, the light source units 20 can also form the light distribution pattern 300 appropriately.

Figure 7:
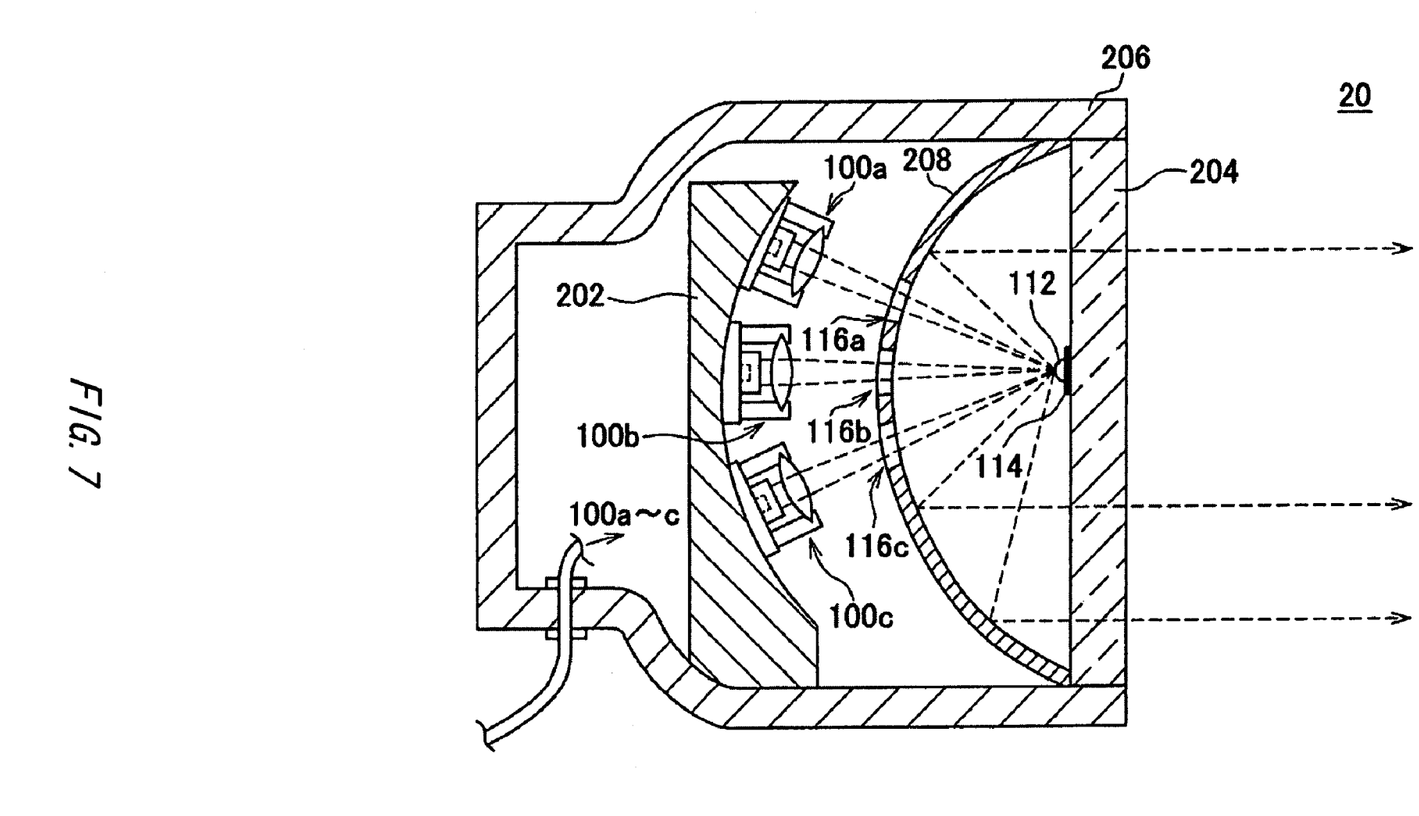
FIG. 7 shows another configuration of the light source unit 20.

FIG. 7 shows another example of the light source unit 20. Parts or components shown in FIG. 7 given the same symbols as those in FIGS. 3 and/or 4 except the points to be described later will not be described because they have the same or similar functions as those in FIGS. 3 and/or 4.

The light source unit 20 includes the light source modules 100a–c. The reflector 208 includes the light transmitting parts 116a–c, which are provided corresponding to the light source modules 100a–c respectively. Each of the light source modules 100a–c focuses the light generated by each of the laser diodes 104 on the same fluorescent material 112 via each of the light transmitting parts 116a–c. The reflector 208 reflects the light from the fluorescent material 112 based on the each light from the light source modules 100a–c to the front of the vehicle via the light transmitting member 204. Since the light from the plurality of laser diodes 104 is focused on the only fluorescent material 112, it is possible to generate the white light from the fluorescent material 112 with higher luminance than that of the light generated by the embodiment using a single laser diode 104.

Figure 8:
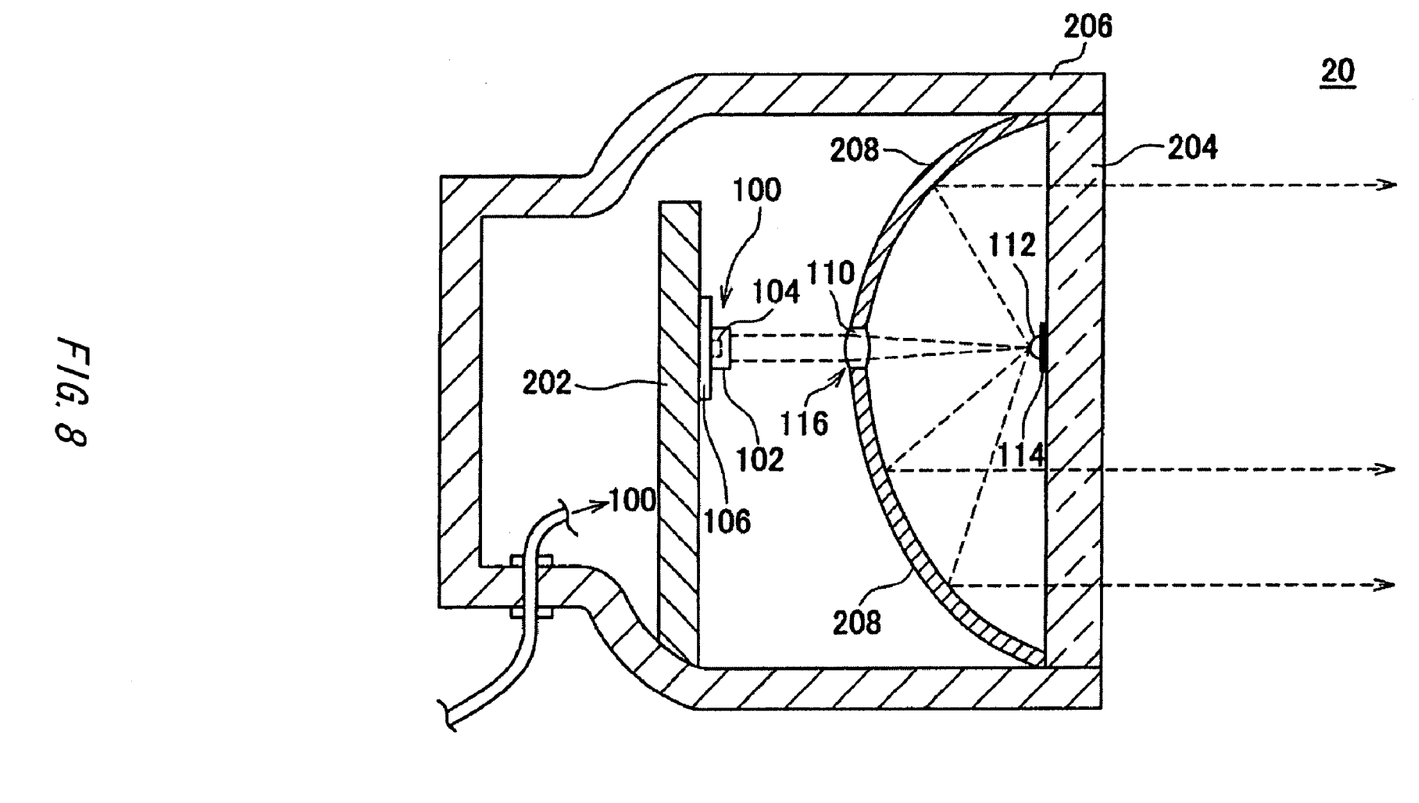
FIG. 8 shows another configuration of the light source unit 20.

FIG. 8 shows another example of the light source unit 20. Parts or components shown Parts or components shown in FIG. 8 given the same symbols as those in FIGS. 3 and/or 4 except the points to be described later will not be described because they have the same or similar functions as those in FIGS. 3 and/or 4.

The light source module 100 includes the laser module 102, the laser diode 104, and the substrate 106. The lens 110 is fixed to the reflector 208 by at least a part of the lens 110 being fitted to the light transmitting part 116. The lens 110 fitted to the light transmitting part 116 focuses the light generated by the laser diode 104 in the laser module 102 on the fluorescent material 112. The reflector 208 reflects the light from the fluorescent material 112 based on the light from the light source module 100 to the front of the vehicle via the light transmitting member 204.

Since the lens 110 is fitted to the light transmitting part 116 in the reflector 208, it is possible to align the lens 110 with the fluorescent material 112. Therefore, when a plurality of the light source units 20 is manufactured, it is not necessary to align each position of the lenses 110 with the fluorescent materials 112 respectively. Accordingly, the number of the steps of the assembly can be reduced and, the fluorescent material 112 and the lens 110 can be positioned with high accuracy. In this example, the lens 110 is fitted to the light transmitting part 116 in the reflector 208 as a separated part from the reflector 208. In another example, the lens 110 and the reflector 208 are integrated as the single member. Thus, the number of the parts and the number of the steps of the assembly can be reduced.

Figure 9:
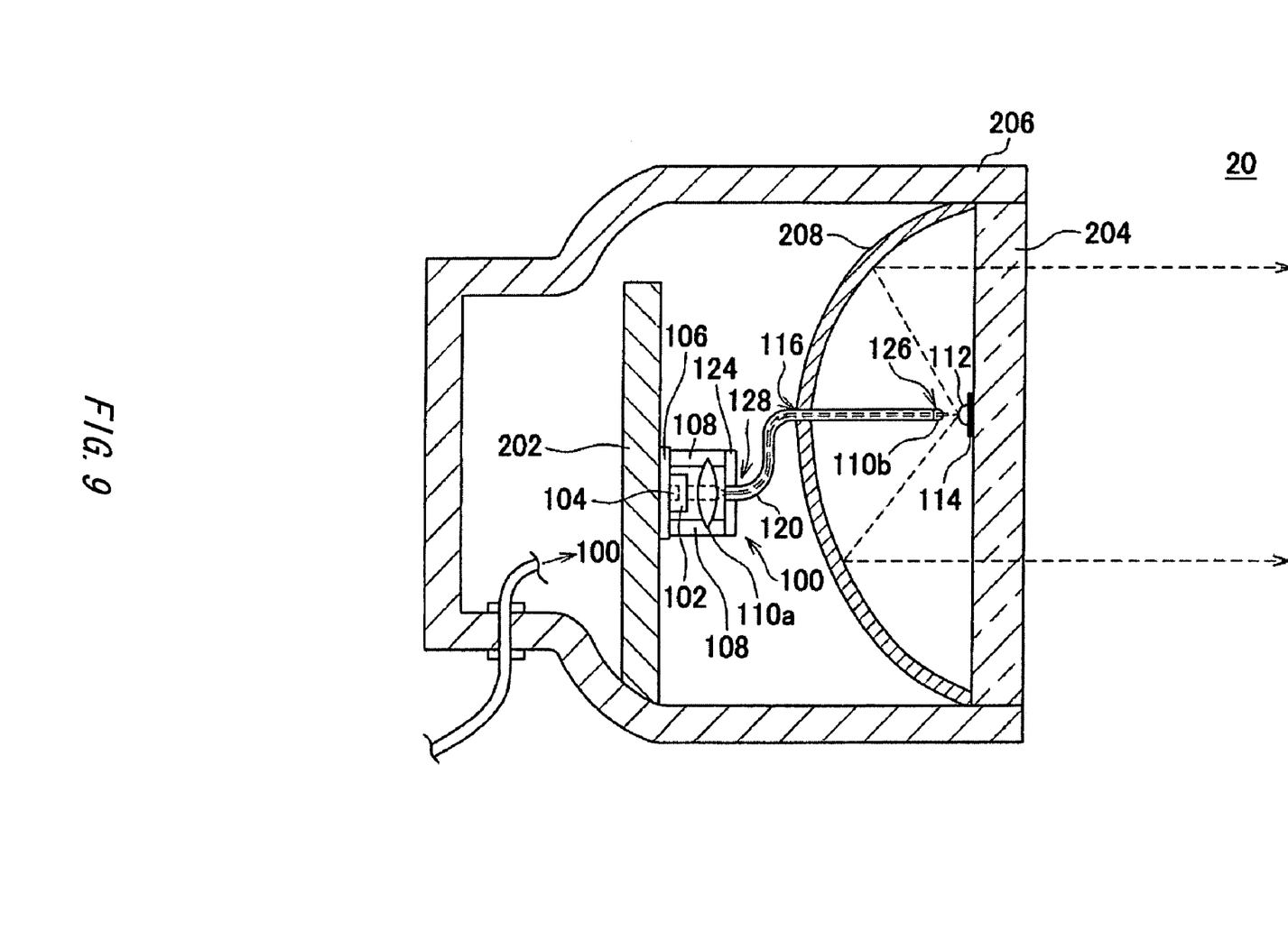
FIG. 9 shows another configuration of the light source unit 20.

FIG. 9 shows another exemplary configuration of the light source unit 20. Parts or components shown in FIG. 9 given the same symbols as those in FIGS. 3 and/or 4 except the points to be described later will not be described because they have the same or similar functions as those in FIGS. 3 and/or 4.

The light source unit 20 includes a plurality of the lenses 110a–b, an optical fiber 120, and a fixing member 124. The lens 110a conducts the light from the laser diode 104 to the optical fiber 120. The optical fiber 120 has an end 126 and an end 128. The optical fiber 120 receives the light from the laser diode 104 at the end 128 via the lens 110a and emits this light from the end 126. The optical fiber 120 is inserted into the light transmitting part 116 of the reflector 208. The end 126 of the optical fiber 120 is fixed by the fixing member 124 such as a wire. An edge of this fixing member 124 is fixed to the light transmitting member 204, for example. The fixing member 124 fixes an end surface of the end 128 opposed to the lens 110a.

The lens 110b is provided at the end 126 of the optical fiber 120, and focuses the light emitted from the end 126 on the fluorescent material 112. The reflector 208 reflects the light from the fluorescent material 112 based on the lens 112b to the front of the vehicle via the light transmitting member 204. In this embodiment, since the light generated by the light transmitting member 204 is conducted by the optical fiber 120, the light path between the lens 110a and the lens 110b can be positioned freely within a space where the optical fiber 120 is permitted to be provided. Therefore the degree of freedom for arrangement of the light source module 100 to the fluorescent material 112 is improved.

Figure 10:
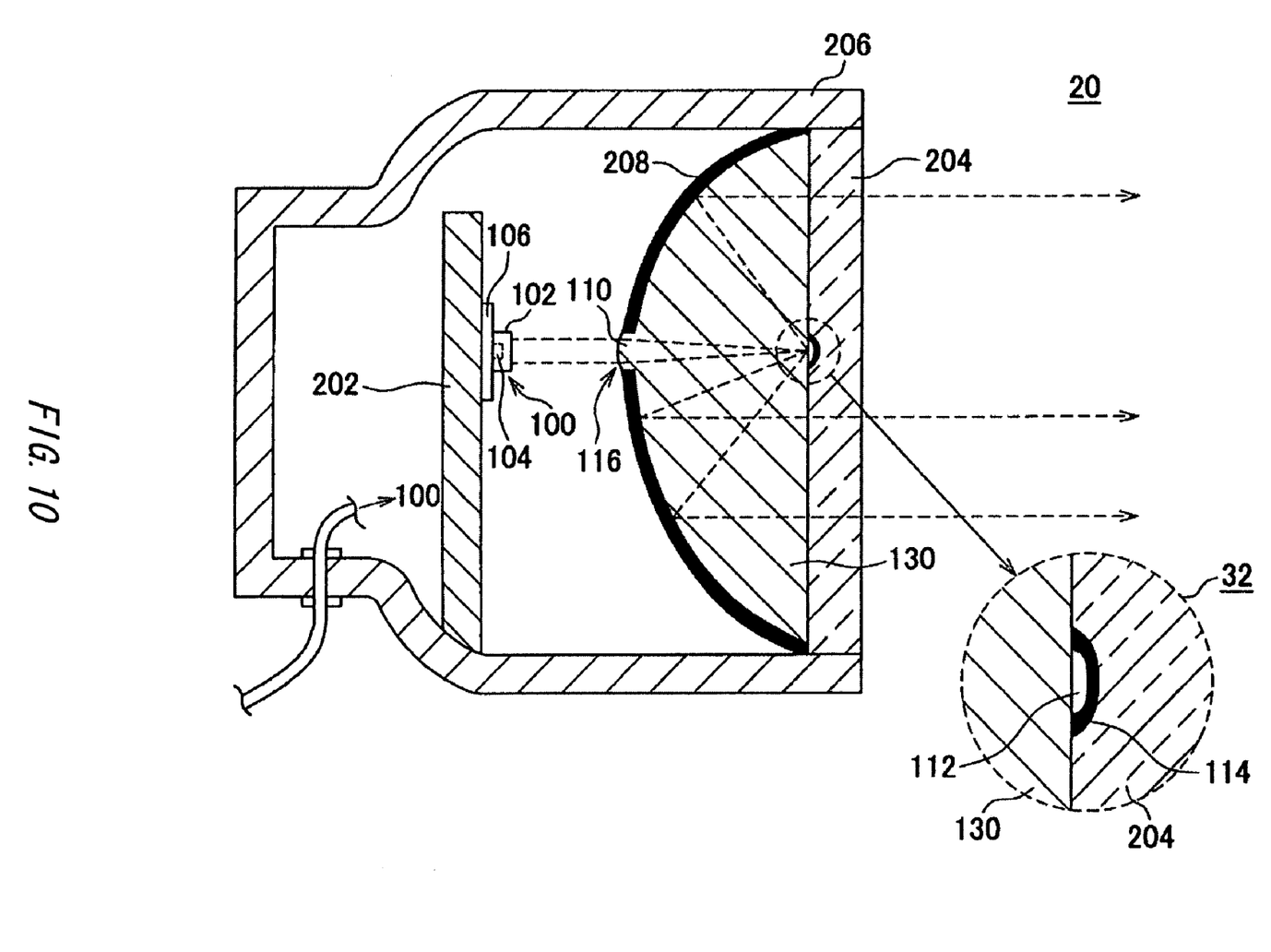
FIG. 10 shows another configuration of the light source unit 20.
Figure 11:
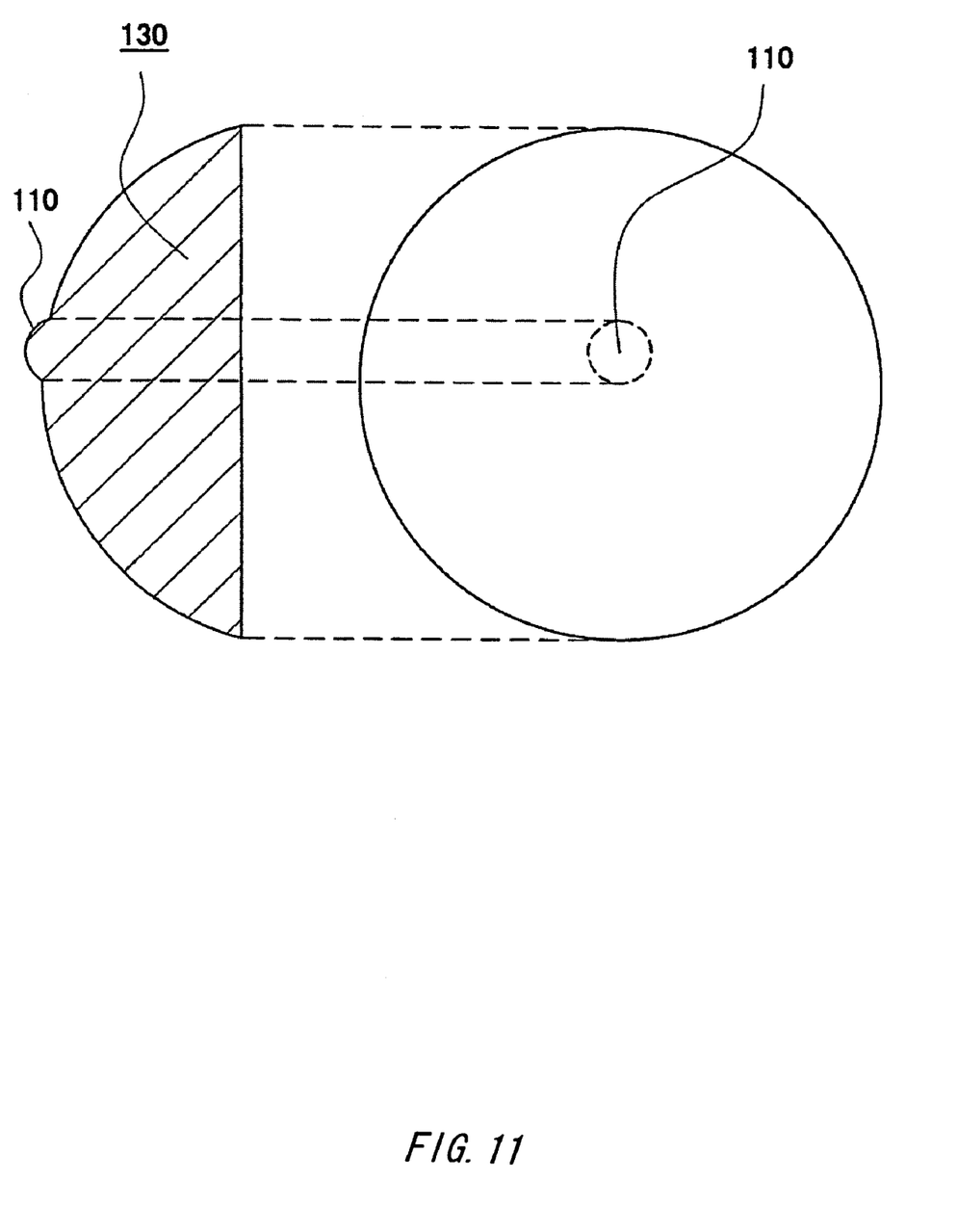
FIG. 11 shows both a cross-sectional view and a front view of the transparent member 130.

FIG. 10 shows another exemplary configuration of the light source unit 20. FIG. 11 shows both a cross-sectional view and a front view of a transparent member 130. Parts or components shown in FIGS. 10 and 11 given the same symbols as those in FIGS. 3 and/or 4 except the points to be described later will not be described because they have the same or similar functions as those in FIGS. 3 and/or 4.

The light source unit 20 further includes the transparent member 130. The transparent member 130 is formed to be extended along a direction from the reflector 208 to the fluorescent material 112. The transparent member 130 is made of material, such as glass or resin, which transmits a light from the fluorescent material 112. The reflector 208 is formed on the surface of the transparent member 130, by metal vapor deposition such as aluminum evaporation. The lens 110 is formed with the transparent member 130 integrally as a single member so that a part of the transparent member 130 is projected, by using the same kind of the material as the transparent member 130. The reflector 114 is coated on a part on a plane that is opposed to the reflector 208, as shown in an enlarger illustration 32. The reflector 114 is put to the plane to be opposed to the reflector 208 in the transparent member 130 across the transparent member 130.

Since the reflector 208, the lens 110, the fluorescent material 112, and the reflector 114 are integrated, it is not necessary to align each position of the reflector 208, the lens 110 and the fluorescent material 112, when a plurality of the light source units 20 is manufactured. Therefore, it is possible to improve the accuracy of the positioning and to reduce the number of the steps of the assembly.

As apparent from the description above, according to this embodiment, the vehicular lamp 10 for generating the light with high luminance can be provided.

Although the present invention has been described by way of exemplary embodiments, it should be understood that those skilled in the art might make many changes and substitutions without departing from the spirit and the scope of the present invention which is defined only by the appended claims.

What is claimed is:

1. A lamp for generating light, comprising:
a semiconductor light emitting element for emitting light;
a fluorescent material, provided away from said semiconductor light emitting element;
a first optical member operable to focus the light generated by said semiconductor light emitting element on said fluorescent material; and
a second optical member having an optical center at a position where said fluorescent material is provided, operable to emit light from said fluorescent material based on the light focused by said first optical member to an outside of the lamp, wherein
the lamp is used as a headlamp in a vehicle, and
said second optical member emits light from said fluorescent material to the outside of the lamp, so that said second optical member forms at least one of a part of a cut line that defines a boundary between a bright region and a dark region of the headlamp.

2. The lamp as claimed in claim 1, wherein
said fluorescent material is provided in a forward direction of said semiconductor light emitting element,
said second optical member is a reflector that is provided between said semiconductor light emitting element and said fluorescent material, and reflects the light entered from said fluorescent material forward, wherein said reflector includes:
a light transmitting part operable to transmit light along a direction from said semiconductor light emitting element to said fluorescent material and, wherein
said first optical member is a lens operable to focus the light transmitted through said light transmitting part on said fluorescent material.

3. The lamp as claimed in claim 2, wherein
said light transmitting part is a hole, provided at a part of said second optical member, and
at least a part of said lens is fitted to said hole, so that said lens is fixed to said second optical member.

4. The lamp as claimed in claim 2, wherein
said semiconductor light emitting element generates ultraviolet light,
said lamp generates white light based on the ultraviolet light, and the lamp further comprises:
a transparent member made of material that transmits white light but obscures ultraviolet light, in a forward direction of said fluorescent material, operable to transmit incident light from said fluorescent material via said second optical member to a front of the vehicle.

5. The lamp as claimed in claim 4, wherein said lamp further comprises:

a second reflector formed on a part on a read plane in said transparent member, operable to reflect light from said fluorescent material in a backward direction, wherein said fluorescent material is coated to at least a part of said second reflector so that said fluorescent material is opposed to said transparent member across said second reflector, and said second optical member reflects the light reflected by said second reflector forward, so that the reflected light is transmitted through said transparent member and said second optical member emits the reflected light to the outside of the lamp.

6. The lamp as claimed in claim 2, further comprising a light transmitting member made of material which transmits a light from said fluorescent material, to be extended along a direction from said second optical member to said fluorescent material, and wherein said second optical member is formed on a part on a surface of said light transmitting member, said lens is formed integrally with said light transmitting part, having the same material of said light transmitting member, and said fluorescent material is coated on a part of a plane that is opposed to said second optical member in said light transmitting member.

7. The lamp as claimed in claim 2, further comprising an optical fiber, wherein said optical fiber receives the light generated by said semiconductor light emitting element at one end, and emits the light from the other end, wherein said first optical member focuses the light emitted from said optical fiber on said fluorescent material.

8. The lamp as claimed in claim 1, further comprising a plurality of said semiconductor light emitting elements, wherein said first optical member focuses the light from the plurality of said semiconductor light emitting elements on said same fluorescent material.

9. The lamp as claimed in claim 1, wherein said semiconductor light emitting element is a laser diode.

* * * * *